United States Patent [19]
Fujisada

[11] Patent Number: 4,863,880
[45] Date of Patent: Sep. 5, 1989

[54] INSB DEVICE MANUFACTURING BY ANODIC OXIDATION

[75] Inventor: Hiroyuki Fujisada, Ibaraki, Japan

[73] Assignee: Agency of Industrial Science & Technology, Ministry of International Trade & Industry, Tokyo, Japan

[21] Appl. No.: 171,779

[22] Filed: Mar. 22, 1988

[30] Foreign Application Priority Data

Mar. 30, 1987 [JP] Japan .................. 62-77114

[51] Int. Cl.[4] .......................... H01L 21/316
[52] U.S. Cl. .................................. 437/237
[58] Field of Search ............ 437/237; 204/96

[56] References Cited

U.S. PATENT DOCUMENTS 4,128,681 12/1978 Kotera et al. ................ 428/138

FOREIGN PATENT DOCUMENTS 60-167352 6/1985 Japan .

OTHER PUBLICATIONS

Davydov et al., Soviet Microelectronics vol. 12, No. 1 (1983), pp. 25–29.
"InSb-MAOS Structure Fabricated by Anodization and Sputtering", H. Fujisada, *Japanese Journal of Applied Physics*, vol. 26, No. 7, Jul. 1987, pp. L1079–L1081.
"Formation of Very Thin Anodic Oxide of InSb", H. Fujisada et al., *Japanese Journal of Applied Physics*, vol. 22, No. 8, Aug. 1983, pp. L525–L527.

*Primary Examiner*—Olik Chaudhuri
*Attorney, Agent, or Firm*—Oblon, Spivak, McClelland, Maier, & Neustadt

[57] ABSTRACT

A method of manufacturing an InSb device that uses an anodic oxide layer as a structural element, utilizing a voltage-controlled mechanism to control the thickness of the anodic oxide layer formation, and in which the anodization time under an anodization limiting voltage is not less than 10 seconds and not more than 20 minutes.

6 Claims, 4 Drawing Sheets and
INSB DEVICE MANUFACTURING BY ANODIC OXIDATION

BACKGROUND OF THE INVENTION

1. Field of the Invention

This invention relates to a method of manufacturing InSb, a compound semiconductor. It particularly relates to a method of manufacturing an InSb device that employs an anodic oxide layer as a structural element.

2. Prior Art Statement

Various methods have been proposed for fabricating semiconductor oxides, which play an important role in semiconductor devices. Because anodic oxides of InSb can be formed at room temperature and exhibit good interface characteristics with InSb, anodic oxide layers play a major role. Because of this, it is essential that anodic oxidation conditions for InSb devices be established.

The InSb anodization process method utilizes the phenomenon of oxidation on the InSb surface by passing a current through an InSb anode immersed in an electrolytic solution or in plasma to form a surface oxide layer. An InSb anodic oxide layer is an excellent electrical insulator, but the anodization conditions may be such as to adversely affect the properties of the interface between the oxide layer and the InSb, or the InSb itself. The constant current process is a widely-used method. The thickness of the anodic oxide layer is controlled by the anodization time under a constant current. However, with this method it is difficult to achieve precise control for a uniform layer thickness over the entire surface. When anodization is performed under a constant voltage, as the oxidation proceeds there is a decrease in the anodization current. When the layer thickness reaches a predetermined value as set in accordance with voltage, the anodization current ceases to flow and the oxidation process comes to a stop. Thus, it becomes possible to control the thickness of the oxide layer by means of the anodization voltage. Hence, by carrying out the anodization for a sufficiently long period for the current to stop flowing, it becomes possible to control the thickness of the oxide layer with precision.

It has however been found that when anodization is conducted for such an extended period, the InSb becomes impregnated with unnecessary impurities that degrade the performance of the InSb device. This has been a problem requiring a solution.

OBJECT AND SUMMARY OF THE INVENTION

An object of this invention is to provide a method of manufacturing an InSb device with an anodic oxide layer of a precise thickness in which anodization under a constant voltage is carried out without a degradation in InSb device performance being produced by an extended period of anodization.

In the InSb device manufacturing method according to the present invention, a voltage-controlled mechanism is utilized to control the thickness of the oxide layer in the course of formation of the anodic oxide layer of the InSb device, with the anodization time under the anodization limiting voltage being from not less than 10 seconds to not more than 20 minutes.

In accordance with this invention, as described in the foregoing, making the InSb anodization time last at least 10 seconds after the anodization limiting voltage has been attained enables the thickness of the anodic oxide layer to be precisely controlled under the anodization limiting voltage, and making this time last no longer than 20 minutes averts any adverse effect on the performance of the InSb devices.

The above and other objects and features of the invention will become more apparent from the following detailed description with reference to the accompanying drawings.

DETAILED DESCRIPTION OF THE PREFERRED EMBODIMENTS

It is well known that the thickness of an anodic oxide layer of InSb can be controlled by means of the anodization voltage, and that with an anodization of up to 15 volts, the thickness of the layer formed will be about 3 nm per volt. This type of constant voltage anodization is effective in controlling the layer thickness. However, applying the predetermined anodization voltage right from the start will cause a large initial current and an oxide layer that is fine and of uniform thickness will not be formed. If in order to prevent this the initial current is kept at a fixed value, the increase in the thickness of the layer that accompanies the oxidation will produce a gradual increase in the voltage. If the voltage is maintained at a constant level after the predetermined anodization voltage has been reached, the current will decrease rapidly until it becomes a very small residual current. This is the constant current constant voltage transition type anodization method.

Figure 1:
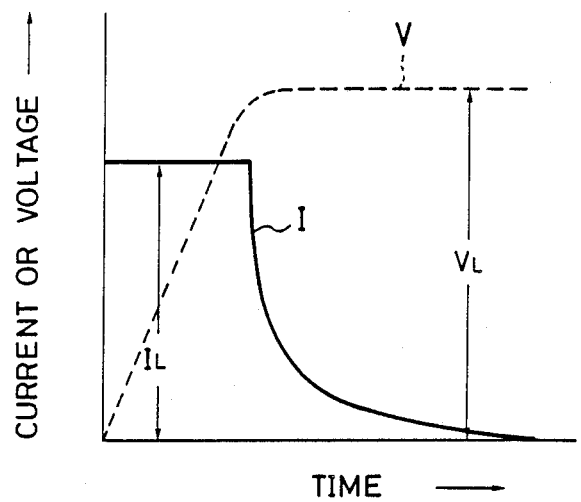
FIG. 1 is a graph showing the time dependence of voltage and current during anodization.

FIG. 1 shows time-plotted changes of anodization voltage V and current I in accordance with this method. The graph shows a fixed current $I_L$ being supplied from the start, but it is not essential that a fixed current is supplied from the start. With the important thing being to avoid a large initial current, it is also possible to gradually raise the voltage to the required anodization voltage by some suitable method.

For precision of expression, in this specification the anodization voltage for controlling the layer thickness shall be referred to as anodization limiting voltage $V_L$. As illustrated in FIG. 1, after voltage V reaches anodization limiting voltage $V_L$ current I decreases rapidly, and if anodization is regarded as terminated when the current reaches the final value, precise control of the layer thickness is possible. That is, oxidation also proceeds after the anodization limiting voltage $V_L$ is reached. Therefore, to confirm that up to that point the oxide layer has been formed over the whole of the predetermined region (S), oxide layer formation proceeds from when the anodization limiting voltage $V_L$ is reached until virtually no current is flowing, or a minimum of 30 minutes.

Basic to the present invention is the finding that when this time exceeds 20 minutes the anodization has a major influence on device characteristics. Also, by the time 10 seconds has passed from when the anodization limiting voltage has been reached the current has decreased fairly considerably and for practical purposes the required voltage control of the layer thickness can be achieved, a fact that enables a minimum value to be set for the anodization time.

Figure 2:
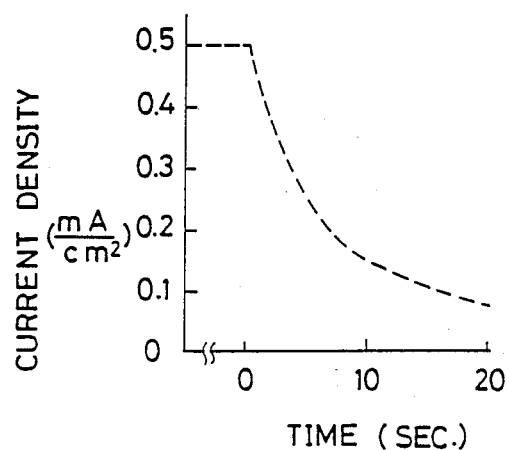
FIG. 2 is a graph showing changes in current density against time elapsed from when the anodization limiting voltage is reached.

FIG. 2 is a graph showing changes in current density plotted against time in the case of anodization carried out in a solution with a pH of 6 that contains citric acid. The initial current density was limited to 0.5 mA/cm$^2$. The anodization limiting voltage was 10 volts. From FIG. 2 it can be seen that the current dropped to about one-third in 10 seconds. A drop of this order makes possible the voltage-controlled formation of a uniform oxide layer of the required thickness over the entire surface. Even if the solution employed is changed, there is no major change in the above phenomenon.

Figure 3:
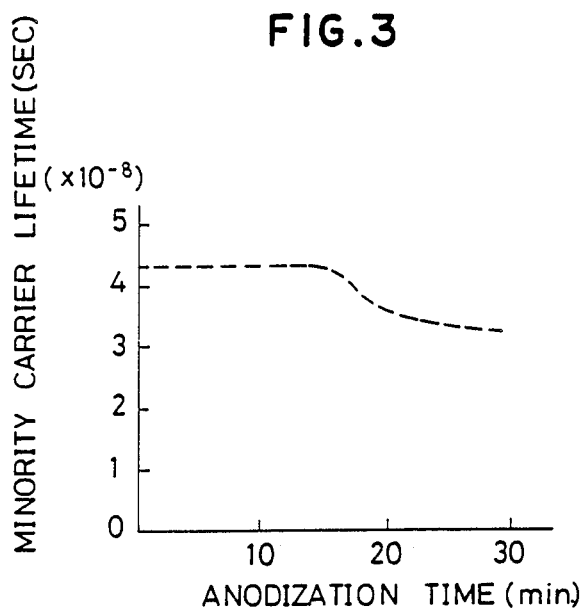
FIG. 3 is a graph showing the relationship between anodization time under the anodization limiting voltage and the minority carrier lifetime.

FIG. 3 is a graph showing the relationship between anodization time under an anodization limiting voltage and the minority carrier lifetime, when the anodization limiting voltage is 10 volts. This shows that if the process time does not exceed 20 minutes, there is no substantial reduction in the carrier lifetime.

From the above FIGS. 2 and 3, in the present invention the anodization time under the anodization limiting voltage has been specified as not less than 10 seconds or more than 20 minutes.

That is, by making the time that anodization continues after the anodization limiting voltage $V_L$ is reached not less than 10 seconds and not more than 20 minutes, in accordance with this invention, the objective of controlling the layer thickness by the anodization voltage V is realized together with an anodization that does not degrade the performance of the InSb device, thereby providing an InSb device that exhibits excellent performance.

Figure 4:
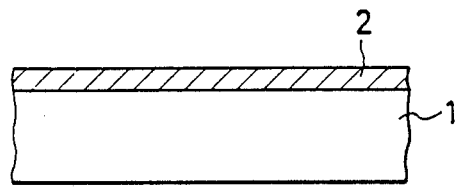
FIG. 4 is a sectional drawing showing the basic structure of an InSb device manufactured according to the method of this invention.

FIG. 4 is a sectional drawing showing the basic structure of an InSb device fabricated according to the method of this invention. In the drawing, reference numeral 1 denotes an InSb substrate and 2 an anodic oxide layer.

The range of the anodization limiting voltage $V_L$ that gives an exceptional increase to the effect of this invention is up to 12 volts. The recognized effect of the invention is less in the case of a voltage range that is over 12 volts than it is in the case of a range not exceeding 12 volts.

Figure 5:
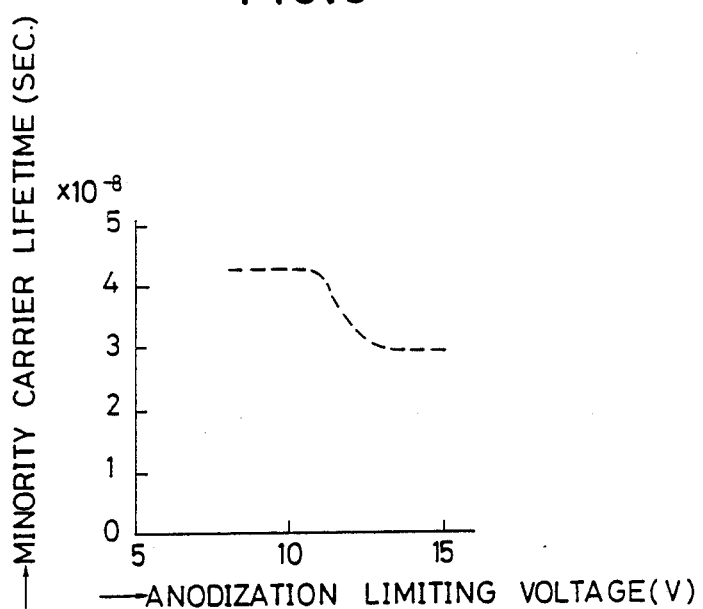
FIG. 5 is a graph showing the relationship between the anodization limiting voltage and the minority carrier lifetime.

FIG. 5 is a graph showing the relationship between the anodization limiting voltage and the minority carrier lifetime. From this graph it can be seen that if the anodization limiting voltage does not exceed 12 volts there is no shortening of the minority carrier lifetime.

Figure 6:
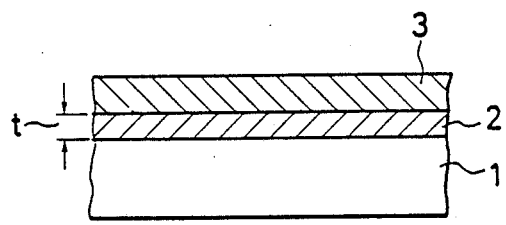
FIG. 6 is an explanatory drawing showing another insulating layer formed on the anodic oxide layer.

FIG. 6 shows an embodiment in which another insulating layer, of sputtered alumina, is employed in combination with the anodic oxide layer 2. The double layer constituted by the anodic oxide layer 2 and the sputtered alumina layer 3 acts as an outstanding insulating layer, but to prevent damage caused by the sputtering from extending to the interface between the anodic oxide layer 2 and the InSb substrate 1, the anodic oxide layer has to have a certain minimum thickness t. As explained below with reference to FIG. 7, this object is achieved by making the anodization limiting voltage $V_L$ a minimum of 9 volts.

Figure 7:
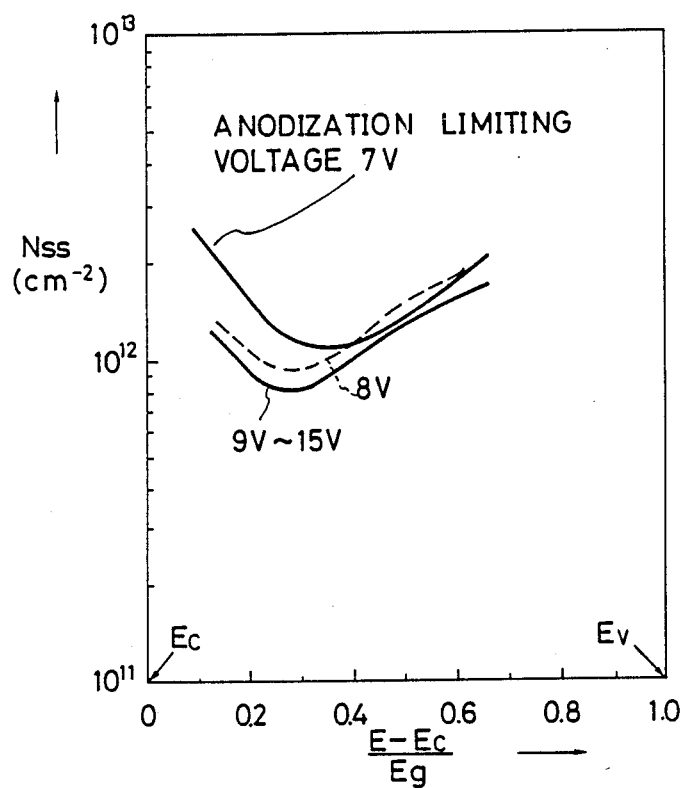
FIG. 7 is a graph showing changes in interface state densities between the InSb and the anodic oxide layer when the anodization limiting voltage is changed.

FIG. 7 is a graph showing changes in interface level density $N_{ss}$ between the InSb and the anodic oxide layer when the anodization limiting voltage is changed. $E_c$, $E_v$ and $E_g$ denote, respectively, the bottom of the conduction band, the upper part of the valence band, and the forbidden band gap. The horizontal axis is $(E-E_c)/E_g$, (E being energy level) and the curves represent anodization limiting voltages of 7, 8, and 9–15 volts. It can be seen from this graph that with a voltage of 9 volts or below sputter damage produces an increase in the interface state densities, degrading the characteristics of the interface. The influence of the sputter damage mentioned with respect to FIG. 7 refers to an example in which an alumina target with a diameter of 100 mm was used with a high-frequency 100-watt power source in an atmosphere of argon gas. Of the sputtering conditions, the influence of the sputtering damage became less when the high-frequency power was reduced. However, at least 100 watts of power is necessary to achieve a stable deposition of an alumina layer, and it is because of this that it was necessary to form a two-layer structure constituted by an anodic oxide layer fabricated at the specified voltage limiting voltage of 9 volts or more and the alumina layer.

Moreover, making the temperature of the manufacturing process for the InSb device including the anodic oxide layer 2 fabricated according to this invention 120° C. or less is highly effective for maintaining the excellent properties of the interface between the anodic oxide layer 2 and the InSb substrate 1 right to the end. Here, it is the part of the fabrication process following the formation of the anodic oxide layer as a structural element of the InSb device that is kept to no more than 120° C.

Figure 8:
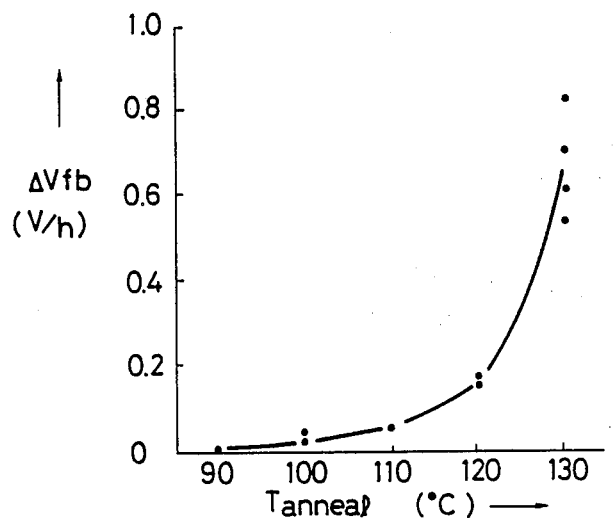
FIG. 8 is a graph showing the increase with temperature of changes in flat-band voltage per one hour of heating.

FIG. 8 is a graph showing the increase with temperature (T anneal) of changes $\Delta V_{fb}$) in the flat-band voltage $V_{fb}$ per one hour of heating. The flat-band voltage $V_{fb}$ acts as a reference with respect to the operating state of a semiconductor device, and changing it is undesirable. As can be seen from FIG. 7, when 120° C. is is exceeded there is an abrupt change in the flat-band voltage $V_{fb}$.

As has been described in the foregoing, in accordance with the present invention, in the formation of an anodic oxide layer in which a voltage-controlled mechanism is utilized to control the thickness of the oxide layer, making the anodization time under the anodization limiting voltage not less than 10 seconds and not more than 20 minutes enables the performance of an InSb device that includes the anodic oxide layer as a structural element to be considerably improved compared with the performance of a conventional type. The anodic oxide layer is essential for the stable formation of an outstanding interface between the layer and the i. As such, in addition to the improved performance provided by the InSb device according to this invention, it can also maintain reliability by ensuring long-term operating stability.

What is claimed is:

1. A method of manufacturing an InSb device having an anodic oxide layer as a structural element, which comprises:
   (a) forming said anodic oxide layer by applying a constant anodization limiting voltage for a time of 10 seconds to about 20 minutes to control the thickness of the anodic oxide layer, and
   (b) completing the manufacture of said device at a temperature of 120° C. or less.

2. The method of manufacturing an InSb device according to claim 1, wherein said anodization limiting voltage is 12 volts or less.

3. The method of manufacturing an InSb device according to claim 1, which includes deposition of a sputtered alumina layer on the formed anodic oxide layer.

4. The method of manufacturing an InSb device according to claim 2, which includes deposition of a sputtered alumina layer on the formed anodic oxide layer.

5. The method of manufacturing an InSb device according to claim 3, wherein said anodic oxide layer is formed at an anodization limiting voltage of 9 volts or above.

6. The method of manufacturing an InSb device according to claim 4, wherein said anodic oxide layer is formed at an anodization limiting voltage of 9 volts or above.

* * * * *